United States Patent
Chen

(10) Patent No.: US 9,159,786 B2
(45) Date of Patent: Oct. 13, 2015

(54) DUAL GATE LATERAL MOSFET

(75) Inventor: Po-Yu Chen, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/400,500

(22) Filed: Feb. 20, 2012

(65) Prior Publication Data

US 2013/0214352 A1  Aug. 22, 2013

(51) Int. Cl.
  *H01L 29/66* (2006.01)
  *H01L 29/06* (2006.01)
  *H01L 29/40* (2006.01)
  *H01L 29/78* (2006.01)
  *H01L 29/423* (2006.01)

(52) U.S. Cl.
  CPC .......... *H01L 29/0653* (2013.01); *H01L 29/407* (2013.01); *H01L 29/66704* (2013.01); *H01L 29/7825* (2013.01); *H01L 29/42368* (2013.01)

(58) Field of Classification Search
  CPC ....... H01L 21/28; H01L 29/78; H01L 29/423; H01L 21/336
  USPC ................ 257/330, 343, 492; 438/270, 330
  See application file for complete search history.

(56) References Cited

U.S. PATENT DOCUMENTS

| | | | |
|---|---|---|---|
| 6,177,704 B1 * | 1/2001 | Suzuki et al. | 257/343 |
| 7,319,256 B1 | 1/2008 | Kraft et al. | |
| 7,405,443 B1 | 7/2008 | Zuniga et al. | |
| 7,772,668 B2 * | 8/2010 | Pan | 257/492 |
| 2007/0032029 A1 * | 2/2007 | Chow et al. | 438/330 |
| 2008/0128801 A1 * | 6/2008 | Izumi | 257/330 |
| 2009/0273026 A1 * | 11/2009 | Wilson et al. | 257/330 |

FOREIGN PATENT DOCUMENTS

| | | |
|---|---|---|
| KR | 2012003019 A | 1/2012 |
| WO | 2005065385 A2 | 7/2005 |

OTHER PUBLICATIONS

Varadarajan, K.R., et al., "250V Integrable Silicon Lateral Trench Power MOSFETs with Superior Specific On-Resistance," 19$^{th}$ International Symposium on Power Semiconductor Devices & ICs, May 27-30, 2007, Jeju, Korea, pp. 233-236.

"A High Voltage Lateral Trench Power MOSFET with Low Specific On-Resistance," Rensselaer polytechnic Institute, Office of Technology Commercialization, www.rpitechnology.com, 2011, 1 pg.

* cited by examiner

*Primary Examiner* — Shaun Campbell
*Assistant Examiner* — Ismail Muse
(74) *Attorney, Agent, or Firm* — Slater & Matsil, L.L.P.

(57) ABSTRACT

A dual gate lateral MOSFET comprises a drift region over a substrate, an isolation region formed in the drift region and a channel region formed in the drift region. The dual gate lateral MOSFET comprises a drain region formed in the drift region and a source region formed in the channel region, wherein the source region and drain region are formed on opposing sides of the isolation region. The dual gate lateral MOSFET further comprises a first gate and a second gate formed adjacent to the source region, wherein the first gate and the second gate are stacked together and separated by a dielectric layer.

18 Claims, 19 Drawing Sheets

DUAL GATE LATERAL MOSFET

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low gate-to-drain capacitance and high breakdown voltage of transistors are desirable for high power applications.

As semiconductor technologies evolve, metal oxide semiconductor field effect transistors (MOSFET) have been widely used in today's integrated circuits. MOSFETs are voltage controlled devices. When a control voltage is applied to the gate of a MOSFET and the control voltage is greater than the threshold of the MOSFET, a conductive channel is established between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; the other is p-channel MOSFETs. According to the structure difference, MOSFETs can be further divided into three sub-categories, planar MOSFETs, lateral double diffused MOS (LDMOS) FETs and vertical double diffused MOSFETs. In comparison with other MOSFETs, the LDMOS is capable of delivering more current per unit area because its asymmetric structure provides a short channel between the drain and the source of the LDMOS.

In order to further improve the performance of the LDMOS, a dual gate structure may be employed to increase the breakdown voltage of the LDMOS and the gate charge. However, as the semiconductor process node keeps shrinking, there may be no space to accommodate a dual gate structure.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a dual gate lateral metal oxide semiconductor field effect transistor (MOSFET). The embodiments of the disclosure may also be applied, however, to a variety of metal oxide semiconductor transistors.

Figure 1:
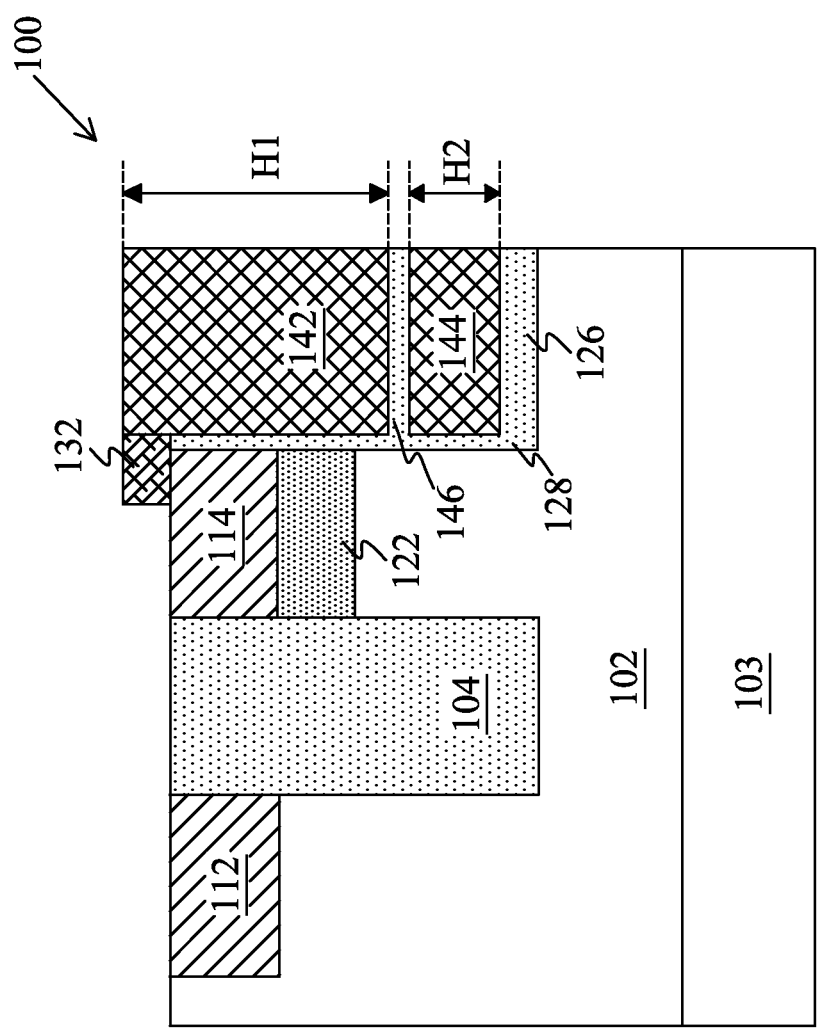
FIG. 1 illustrates a simplified cross-sectional view of a dual gate lateral MOSFET in accordance with an embodiment.

FIG. 1 illustrates a simplified cross-sectional view of a dual gate lateral MOSFET in accordance with an embodiment. The dual gate lateral MOSFET 100 includes a substrate 103 with a first conductivity and an epitaxial region 102 with a second conductivity grown from the substrate 103. A first drain/source region 112 and a second drain/source region 114 formed in the epitaxial region 102 over the substrate 103. An isolation region 104 is formed between the first drain/source region 112 and the second drain/source region 114. The dual gate lateral MOSFET 100 further comprises a body region 122 with the first conductivity formed in the epitaxial region 102 over the substrate 103. As shown in FIG. 1, the body region 122 is formed underneath the second drain/source region 114.

The dual gate lateral MOSFET 100 may comprise two gates stacked together. As shown in FIG. 1, the first gate 142 is on top of the second gate 144. The first gate 142 and the second gate 144 are separated by a dielectric layer 146. In accordance with an embodiment, the first gate 142 may be a gate coupled to a control signal. When the control signal is greater than the threshold voltage of the dual gate lateral MOSFET 100, the dual gate lateral MOSFET 100 is turned on. On the other hand, when the control signal is less than the threshold voltage, the dual gate lateral MOSFET 100 is turned off accordingly. The second gate 144 may be a floating gate or coupled to a bias voltage source.

As shown in FIG. 1, a sidewall dielectric layer 128 and a bottom dielectric layer 126 provide isolation between dual gates 142, 144 and their surrounding semiconductor regions (e.g., second drain/source region 114). In addition, a spacer 132 provides isolation between the first gate 142 and the second drain/source region 114.

The dimensions of the first gate 142 and the second gate 144 are shown in FIG. 1. In particular, the height of the first gate 142 is defined as H1. The height of the second gate 144 is defined as H2. In accordance with an embodiment, the ratio between H1 and H2 is in a range from about 3 to about 4.

One skilled in the art will recognize that FIG. 1 illustrates an ideal profile. The ratio between H1 and H2 may vary after subsequent fabrication processes. The ratio between H1 and H2 shown in FIG. 1 is used to illustrate the inventive aspects of the various embodiments. The disclosure is not limited to any particular ratio between the height of the first gate 142 and the height of the second gate 144.

The substrate 103 may be formed of silicon, silicon germanium, silicon carbide or the like. The epitaxial layer region 102 is formed over the substrate 102. In accordance with an embodiment, the substrate 103 is a p-type substrate. The epitaxial region 102 may be doped with an n-type dopant such as phosphorous to a doping density of about $10^{15}/cm^3$ to $10^{18}/cm^3$. It should be noted that other n-type dopants such as arsenic, nitrogen, antimony, combination thereof, or the like, could alternatively be used. It should further be noted that the epitaxial region 102 of the dual gate lateral MOSFET 100 may be alternatively referred to as a drift region.

In accordance with an embodiment, when the substrate 103 is p-type, the body region 122 is a p-type body region. The body region 122 is formed by implanting p-type doping materials such as boron, gallium, aluminum, indium, combinations thereof, or the like. In accordance with an embodiment, a p-type material such as boron may be implanted to a doping density of about $10^{15}/cm^3$ to $10^{18}/cm^3$. Alternatively, the body region 122 can be formed by a diffusion process. The body region 122 of the lateral MOSFET 100 may be alternatively referred to as a channel region.

The first drain/source region 112 is formed in the epitaxial region 102. In accordance with an embodiment, when the substrate 103 is p-type, the drain/source regions are formed of n-type dopants. The first drain/source region 112 functions as a drain of the dual gate lateral MOSFET 100. The drain region may be formed by implanting an n-type dopant such as phosphorous at a concentration of between about $10^{19}/cm^3$ and about $5 \times 10^{19}/cm^3$.

The second drain/source region 114 is formed in the p-type body region 122. In accordance with an embodiment, the second drain/source region 114 may be a source of the dual gate lateral MOSFET 100. The source region may be formed by implanting an n-type dopant such as phosphorous at a concentration of between $10^{19}/cm^3$ and about $5 \times 10^{19}/cm^3$. As shown in FIG. 1, the source region is formed adjacent to the isolation region 104 on the opposite side from the drain (the first drain/source region 112).

The isolation region 104 is used to isolate active regions so as to prevent leakage current from flowing between adjacent active regions. The isolation region 104 can be formed by various ways (e.g., thermally grown, deposited) and materials (e.g., silicon oxide, silicon nitride). In this embodiment, the isolation region 104 may be fabricated by using a shallow trench isolation (STI) technique.

One advantageous feature of a dual gate lateral MOSFET is that the dual structure shown in FIG. 1 helps to improve the breakdown voltage and the gate-to-drain charge of the lateral MOSFET 100. In other words, the dual gate structure helps to maintain the breakdown voltage of a lateral MOSFET. In addition, the dual gate structure can reduce the gate charge of the lateral MOSFET 100 so that the switching losses of the lateral MOSFET 100 may be reduced. Furthermore, the stacked dual gate structure of FIG. 1 helps to reduce the pitch of the lateral MOSFET 100. Such a reduced pitch may help to reduce the channel length as well as the turn-on resistance of the lateral MOSFET 100.

Figure 2:
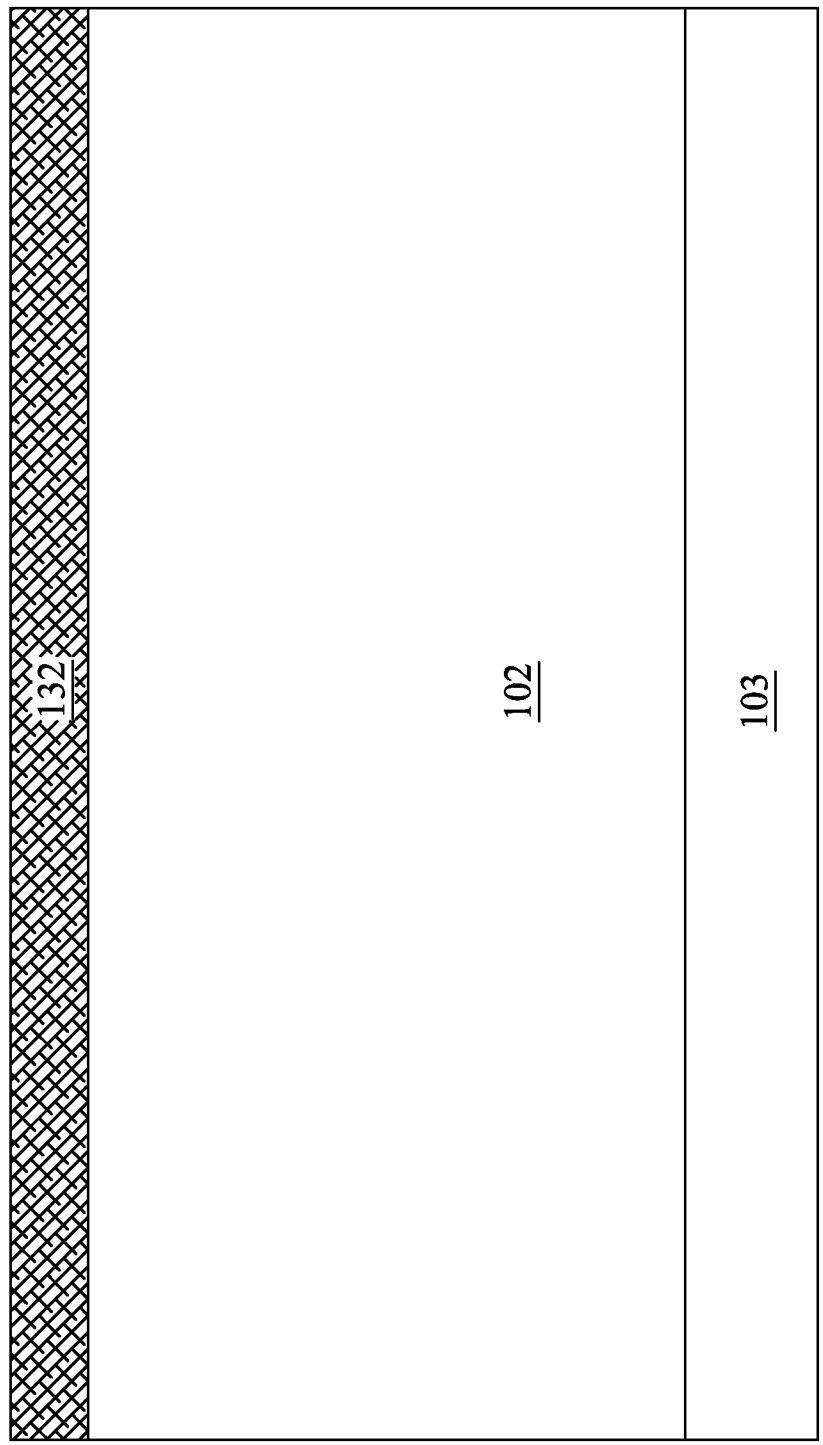
FIG. 2 illustrates a cross section view of a semiconductor device after a dielectric layer is applied to the substrate in accordance with an embodiment.

FIGS. 2-19 illustrates cross section views of intermediate steps of fabricating a dual gate lateral MOSFET in accordance with an embodiment. FIG. 2 illustrates a cross section view of a semiconductor device after a dielectric layer is applied to the substrate in accordance with an embodiment. As shown in FIG. 2, a dielectric layer 132 is formed on top of an epitaxial layer 102 over a substrate 103. As described above with reference to FIG. 1, the substrate 103 may be a p-type substrate and the epitaxial layer 103 may be an n-type region grown from the substrate 103.

The dielectric layer 132 may be formed of various dielectric materials commonly used in integrated circuit fabrication. For example, the dielectric layer 132 may be formed of silicon dioxide, silicon nitride or a doped glass layer such as boron silicate glass and the like. Alternatively, dielectric layer may be a layer of silicon nitride, a silicon oxynitride layer, a polyamide layer, a low dielectric constant insulator or the like. In addition, a combination of the foregoing dielectric materials may also be used to form the dielectric layer 132. In accordance with an embodiment, the dielectric layer 132 may be formed using suitable techniques such as sputtering, oxidation and/or chemical vapor deposition (CVD).

Figure 3:
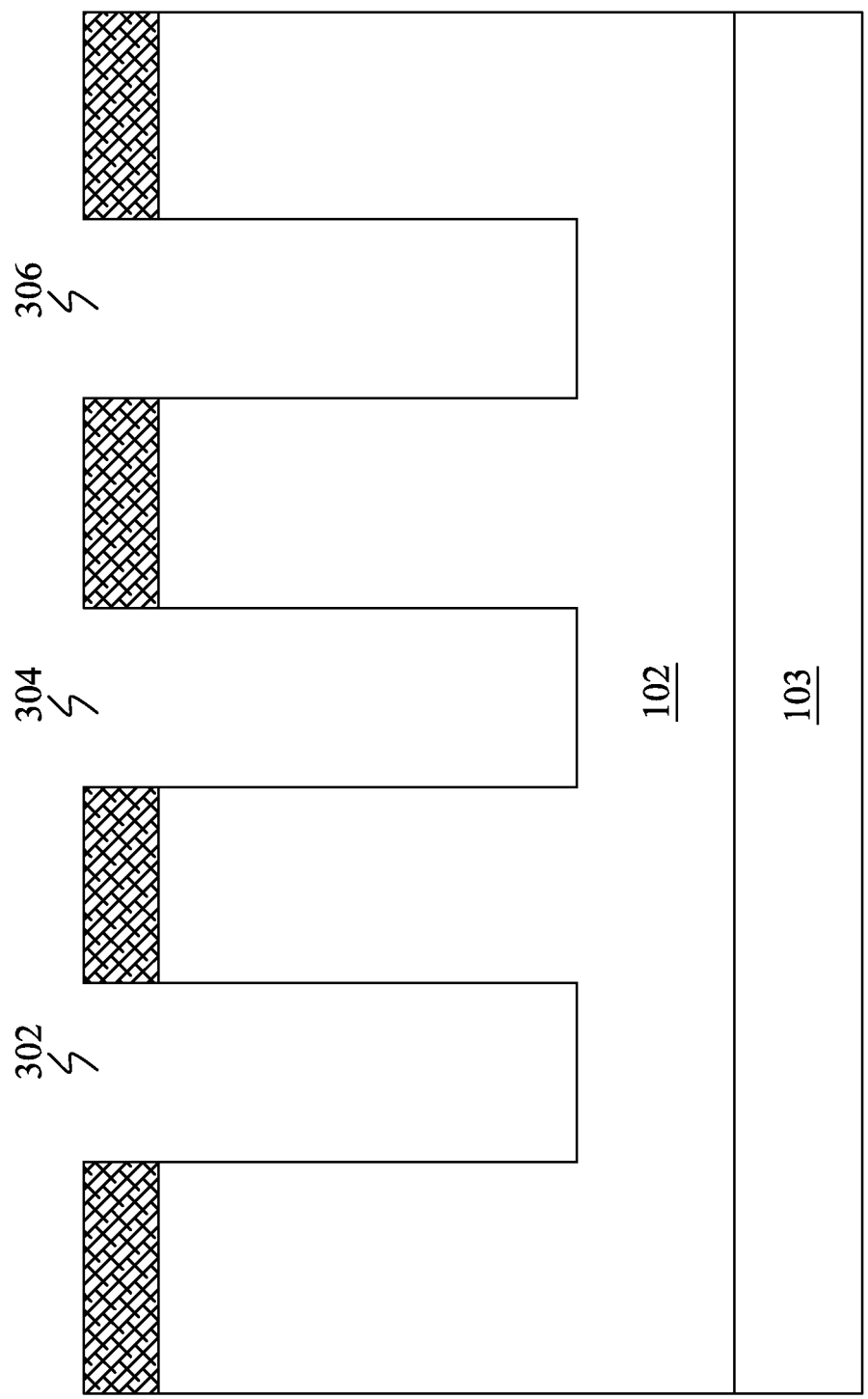
FIG. 3 illustrates a cross section view of the semiconductor device shown in FIG. 2 after an etching process is applied to the semiconductor device in accordance with an embodiment.

FIG. 3 illustrates a cross section view of the semiconductor device shown in FIG. 2 after an etching process is applied to the semiconductor device in accordance with an embodiment. In accordance with an embodiment, a patterned mask (not shown), such as a photoresist mask and/or a hard mask, is formed on the dielectric layer 132 using deposition and photolithography techniques. Thereafter, an etching process, such as a reactive ion etch (RIE) or other dry etch, an anisotropic wet etch, or any other suitable anisotropic etch or patterning process, is performed to form trenches 302, 304 and 306.

Figure 4:
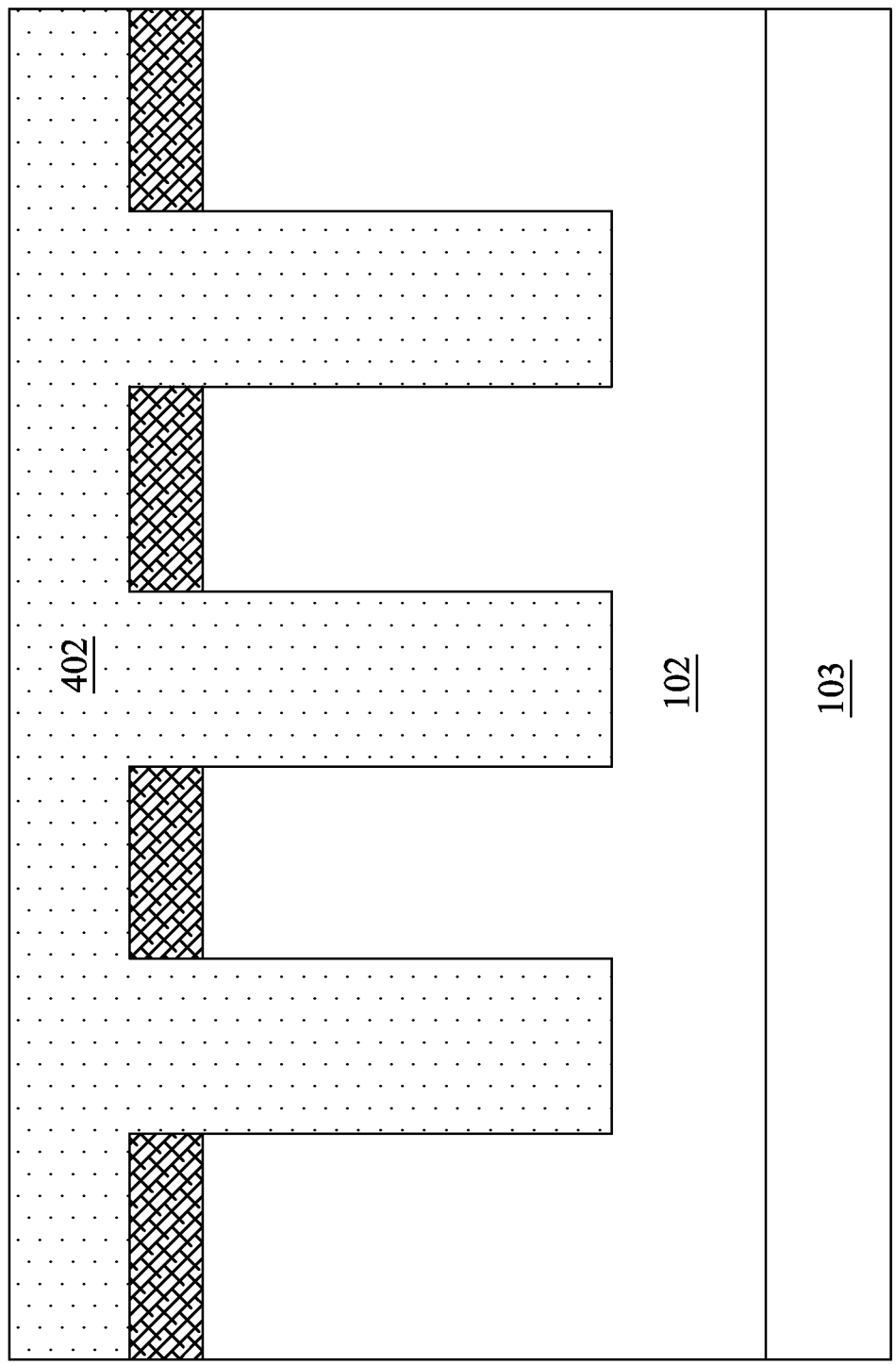
FIG. 4 illustrates a cross section view of the semiconductor device shown in FIG. 3 after dielectric materials are filled into the trenches shown in FIG. 3 in accordance with an embodiment.

FIG. 4 illustrates a cross section view of the semiconductor device shown in FIG. 3 after dielectric materials are filled into the trenches shown in FIG. 3 in accordance with an embodiment. In accordance with an embodiment, the isolation regions (e.g., isolation region 104 shown in FIG. 1) may be formed by first forming trenches and then filling the trenches with a dielectric material. The trenches (shown in FIG. 3) are filled with a dielectric material 402 thereby forming the isolation region 104 as illustrated in FIG. 1. The dielectric material 402 may comprise, for example, a thermal oxidation, a CVD silicon oxide or the like. It may also comprise a combination of materials, such as silicon nitride, silicon oxynitride, high-k dielectrics, low-k dielectrics, CVD poly-silicon or other dielectrics.

Figure 5:
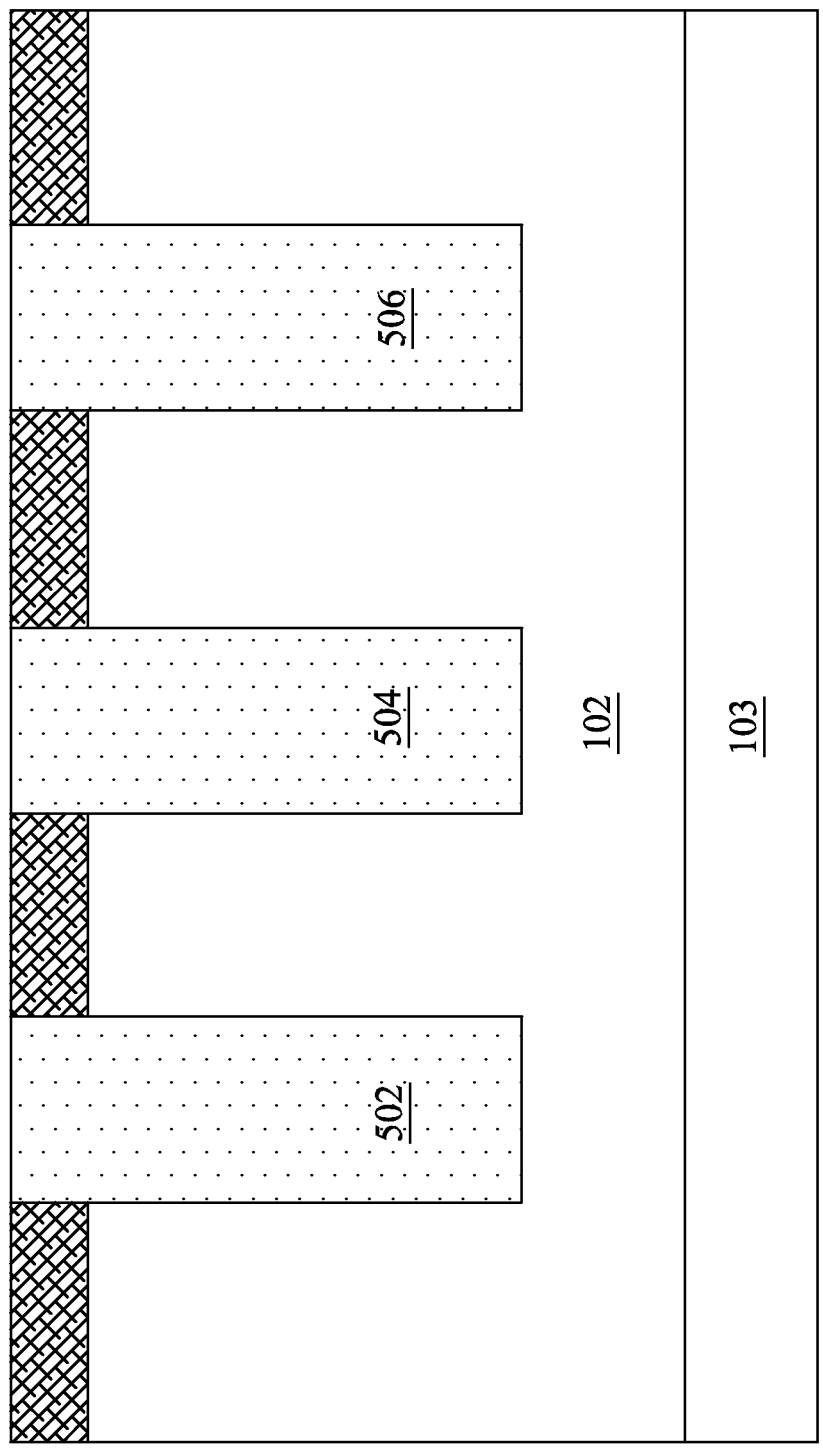
FIG. 5 illustrates a cross section view of the semiconductor device shown in FIG. 4 after a chemical mechanical polish (CMP) process is applied to the top surface shown in FIG. 3 in accordance with an embodiment.

FIG. 5 illustrates a cross section view of the semiconductor device shown in FIG. 4 after a chemical mechanical polish (CMP) process is applied to the top surface shown in FIG. 3 in accordance with an embodiment. A planarization process, such as CMP or etch back step, may be performed to planarize an upper surface of the dielectric material 402. As shown in FIG. 5, a portion of the dielectric material 402 has been removed as a result.

Figure 6:
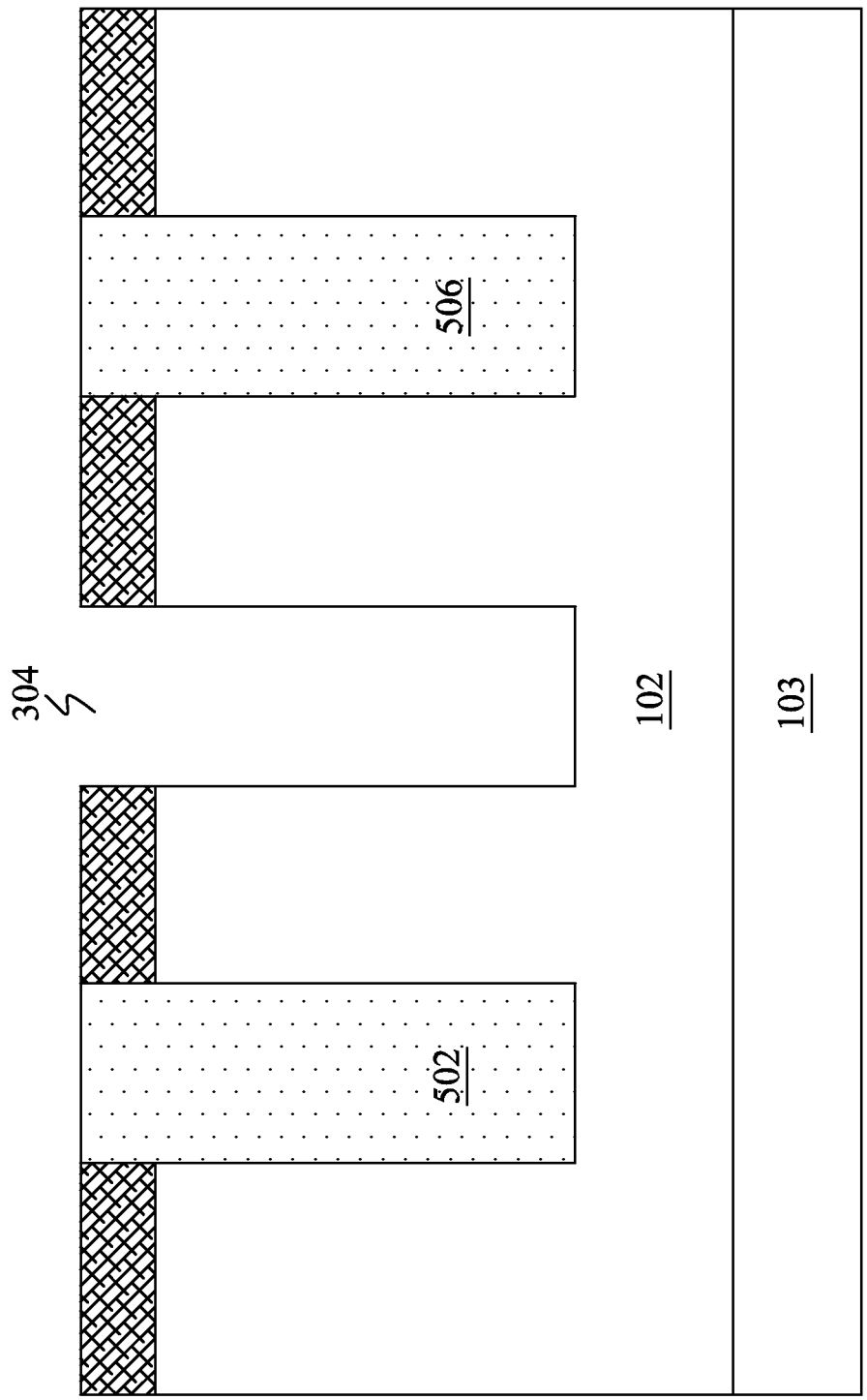
FIG. 6 illustrates a cross section view of the semiconductor device shown in FIG. 5 after an anisotropic etching process is applied to a trench of the semiconductor device in accordance with an embodiment.

FIG. 6 illustrates a cross section view of the semiconductor device shown in FIG. 5 after an anisotropic etching process is applied to a trench of the semiconductor device in accordance with an embodiment. A patterned mask (not shown), such as a photoresist mask and/or a hard mask, is formed on the top surface of the semiconductor device using deposition and photolithography techniques. An anisotropic etching process is applied to the trench 304. As a result, the dielectric material filled in the trench 304 has been removed.

Figure 7:
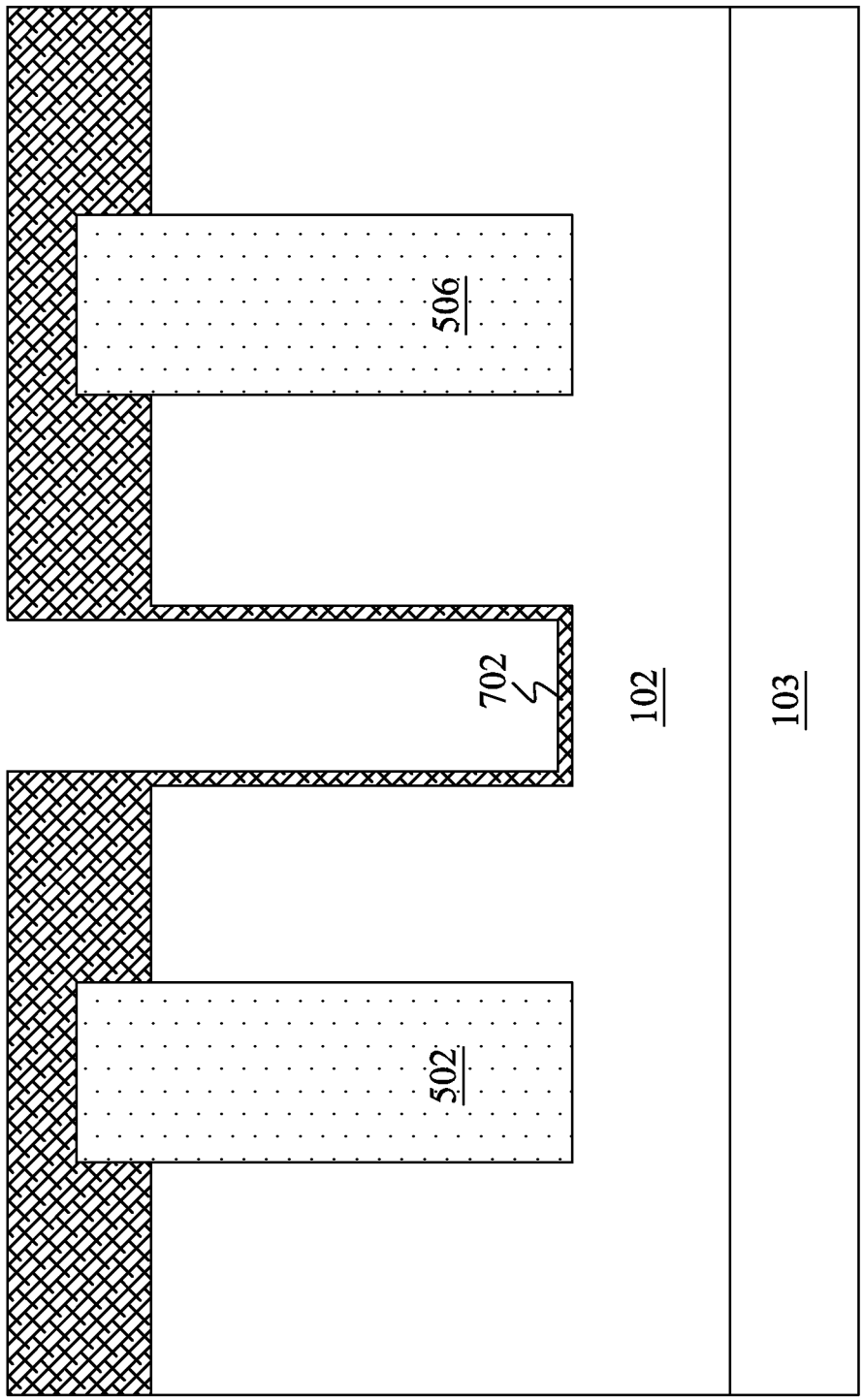
FIG. 7 illustrates a cross section view of the semiconductor device shown in FIG. 6 after a thin dielectric layer is formed in the trench in accordance with an embodiment.

FIG. 7 illustrates a cross section view of the semiconductor device shown in FIG. 6 after a thin dielectric layer is formed in the trench in accordance with an embodiment. The thin dielectric layer 702 may be may be an oxide layer thermally grown in the trench 304. Alternatively, the thin dielectric layer 702 can be formed by other suitable techniques such as CVD.

Figure 8:
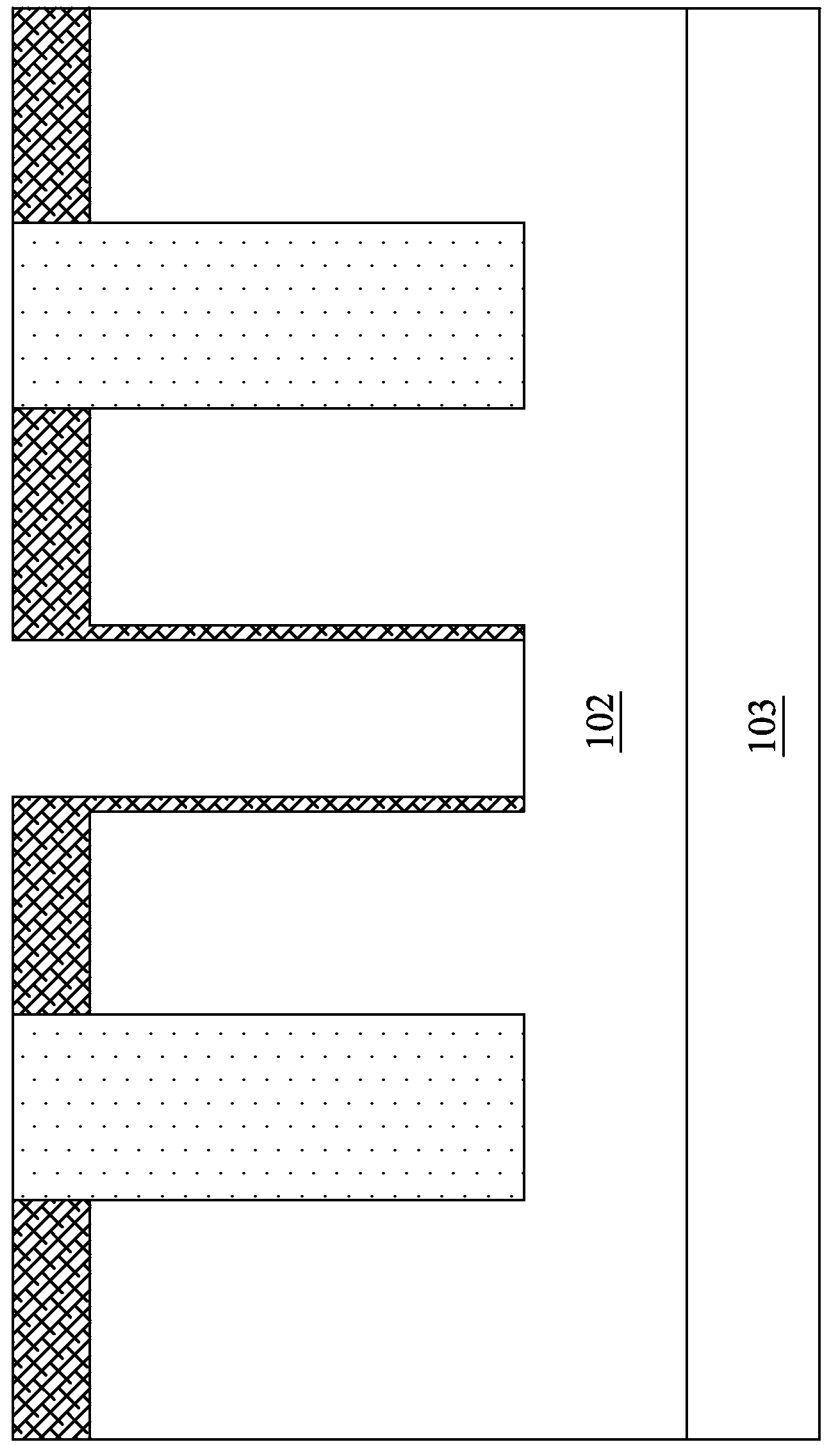
FIG. 8 illustrates a cross section view of the semiconductor device shown in FIG. 7 after an anisotropic etching process is applied to the trench 304 in accordance with an embodiment.

FIG. 8 illustrates a cross section view of the semiconductor device shown in FIG. 7 after an anisotropic etching process is applied to the trench 304 in accordance with an embodiment. An anisotropic etching process is applied to the trench 304. By controlling the strength and direction of the etching process, the bottom of the thin dielectric layer 702 has been removed as a result.

Figure 9:
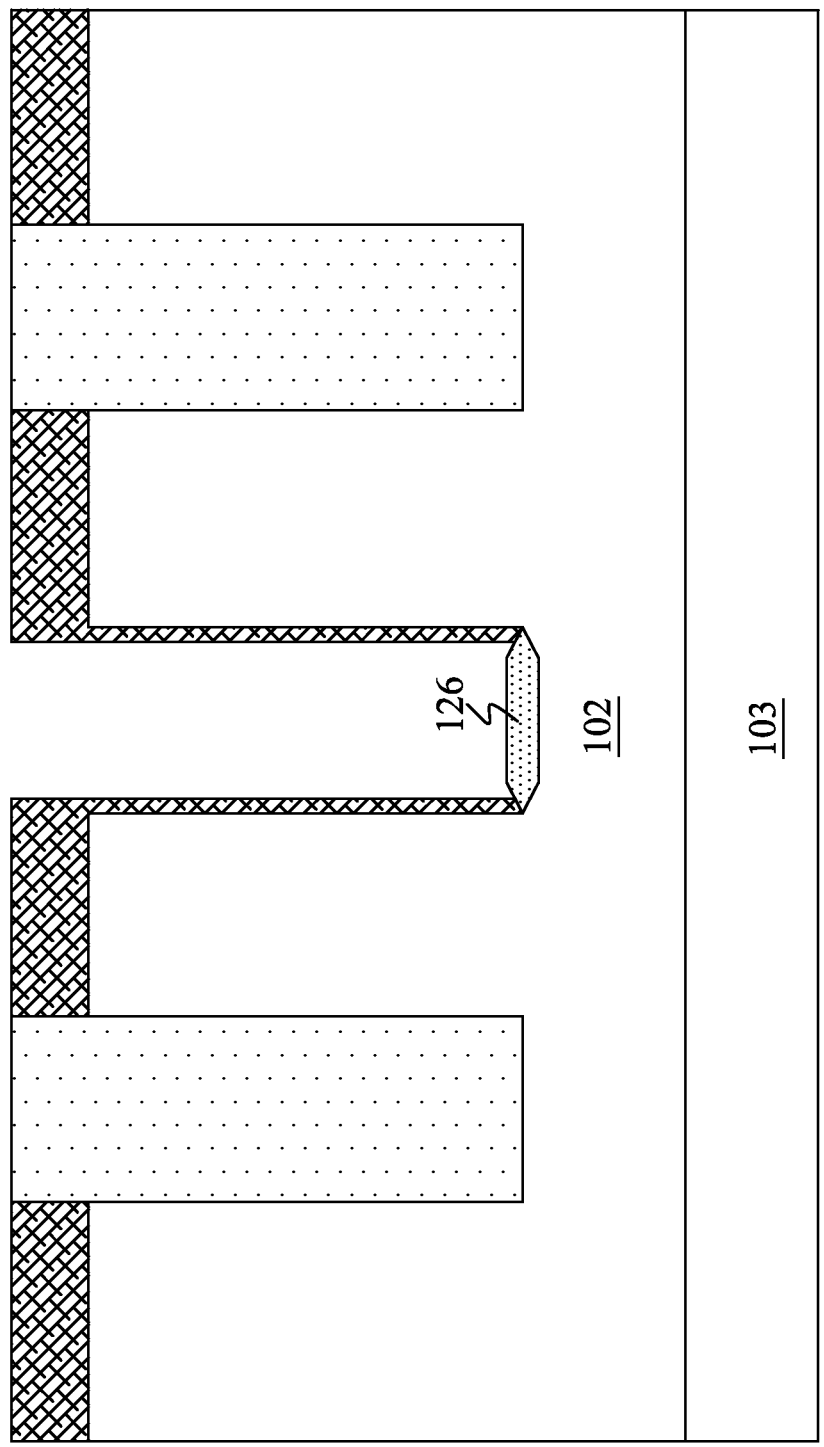
FIG. 9 illustrates a cross section view of the semiconductor device shown in FIG. 8 after a bottom dielectric layer 126 is formed at the bottom of the trench 304 in accordance with an embodiment.

FIG. 9 illustrates a cross section view of the semiconductor device shown in FIG. 8 after a bottom dielectric layer 126 is formed at the bottom of the trench 304 in accordance with an embodiment. The bottom dielectric layer 126 may be an oxide layer thermally grown in the trench 304. As shown in FIG. 9, the two terminals of the bottom dielectric layer 126 are relatively small in comparison with the middle portion of the bottom dielectric layer 126. It should be noted that the bottom dielectric layer 126 can be formed by other suitable techniques such as CVD.

Figure 10:
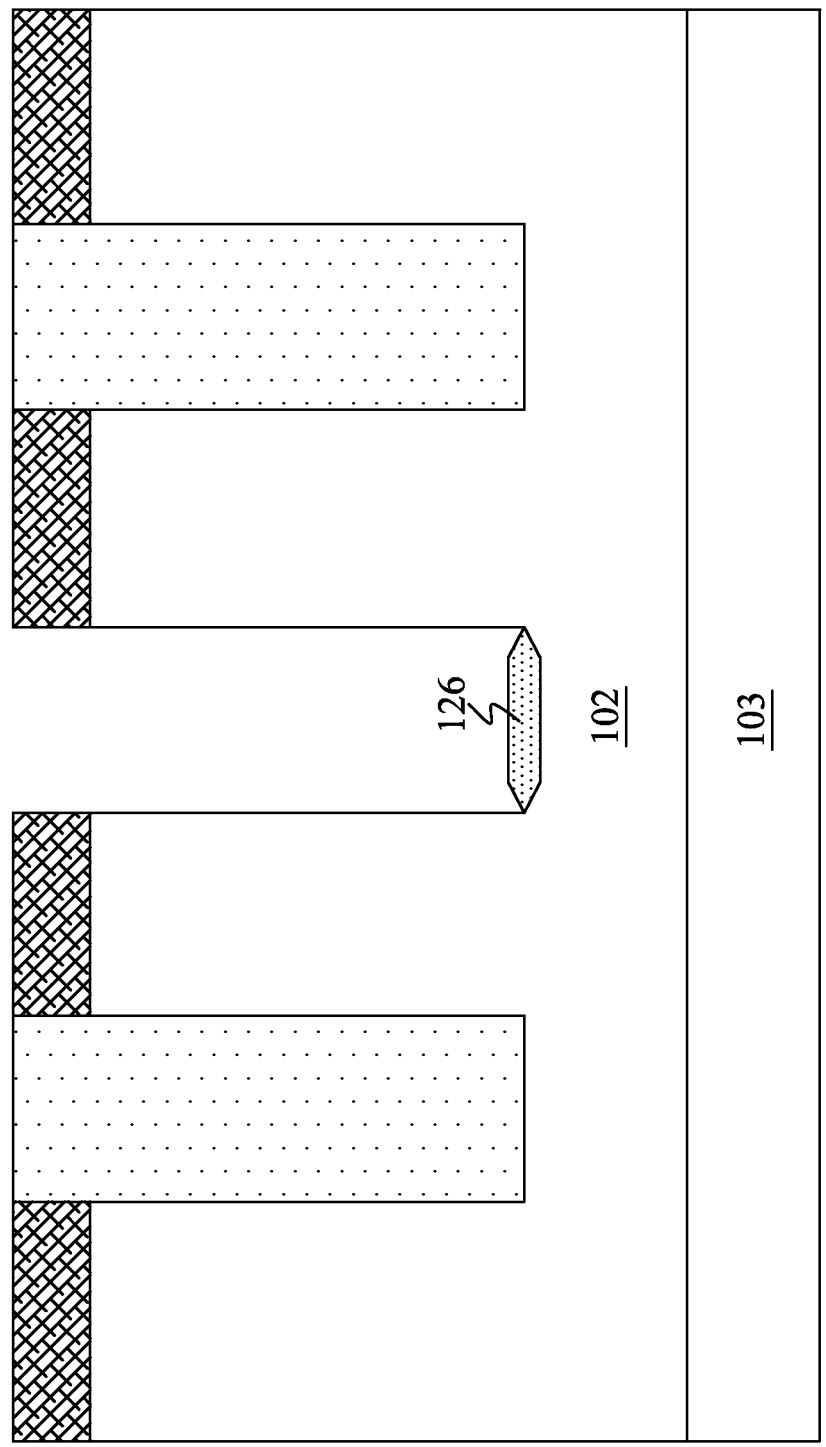
FIG. 10 illustrates a cross section view of the semiconductor device shown in FIG. 9 after an isotropic etching process is applied to the trench 304 in accordance with an embodiment.

FIG. 10 illustrates a cross section view of the semiconductor device shown in FIG. 9 after an isotropic etching process is applied to the trench 304 in accordance with an embodiment. An anisotropic etching process is applied to the trench 304. The thin liner dielectric layer on the sidewalls of the trench 304 has been removed as a result.

Figure 11:
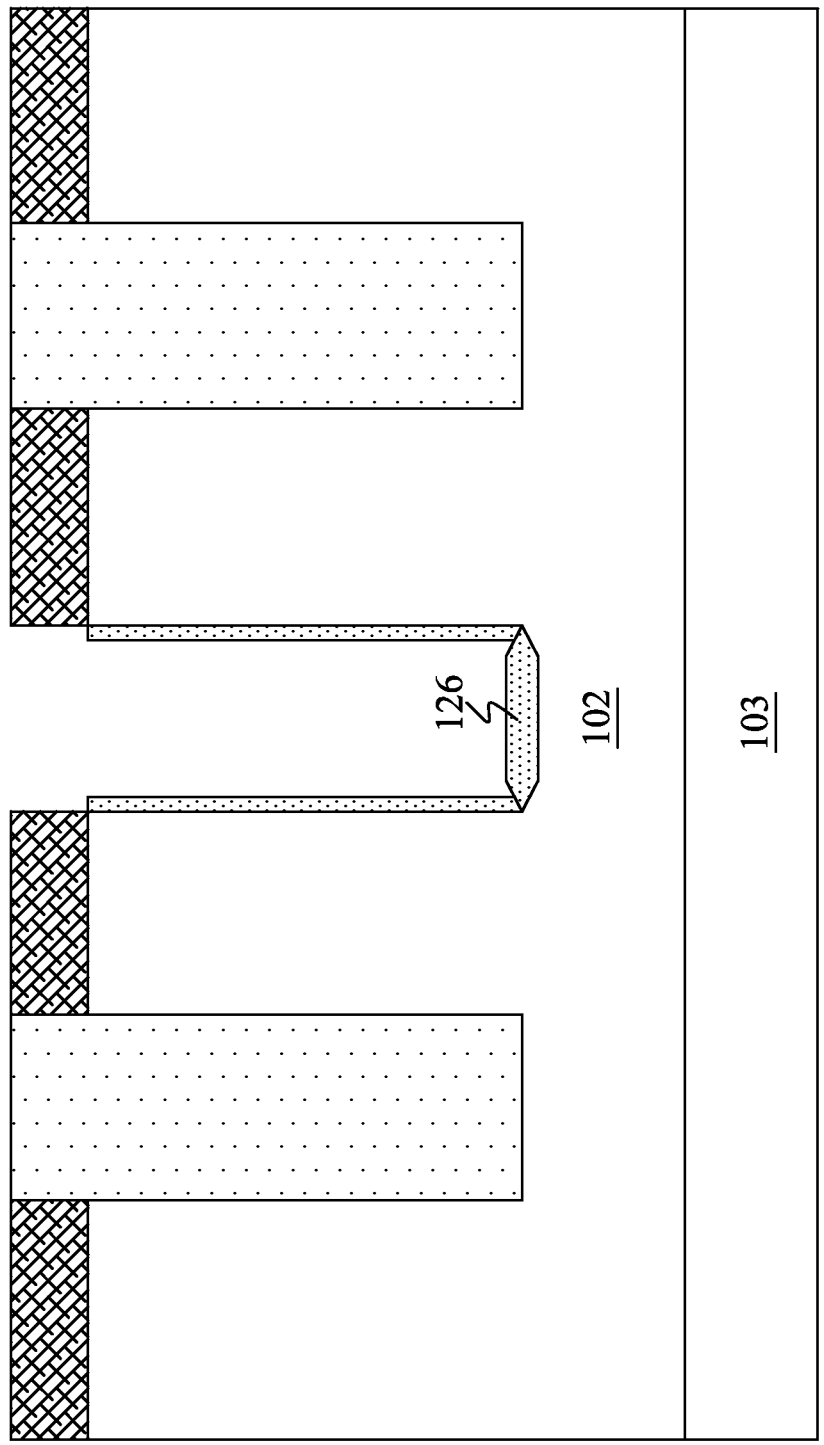
FIG. 11 illustrates a cross section view of the semiconductor device shown in FIG. 10 after a thin liner oxide layer is formed on the sidewalls of the trench 304 in accordance with an embodiment.

FIG. 11 illustrates a cross section view of the semiconductor device shown in FIG. 10 after a thin liner oxide layer is formed on the sidewalls of the trench 304 in accordance with an embodiment. The thin oxide layer may be thermally grown in the trench 304. The dielectric layer on the top surface prevents any additional oxidation on the top surface of the semiconductor device.

Figure 12:
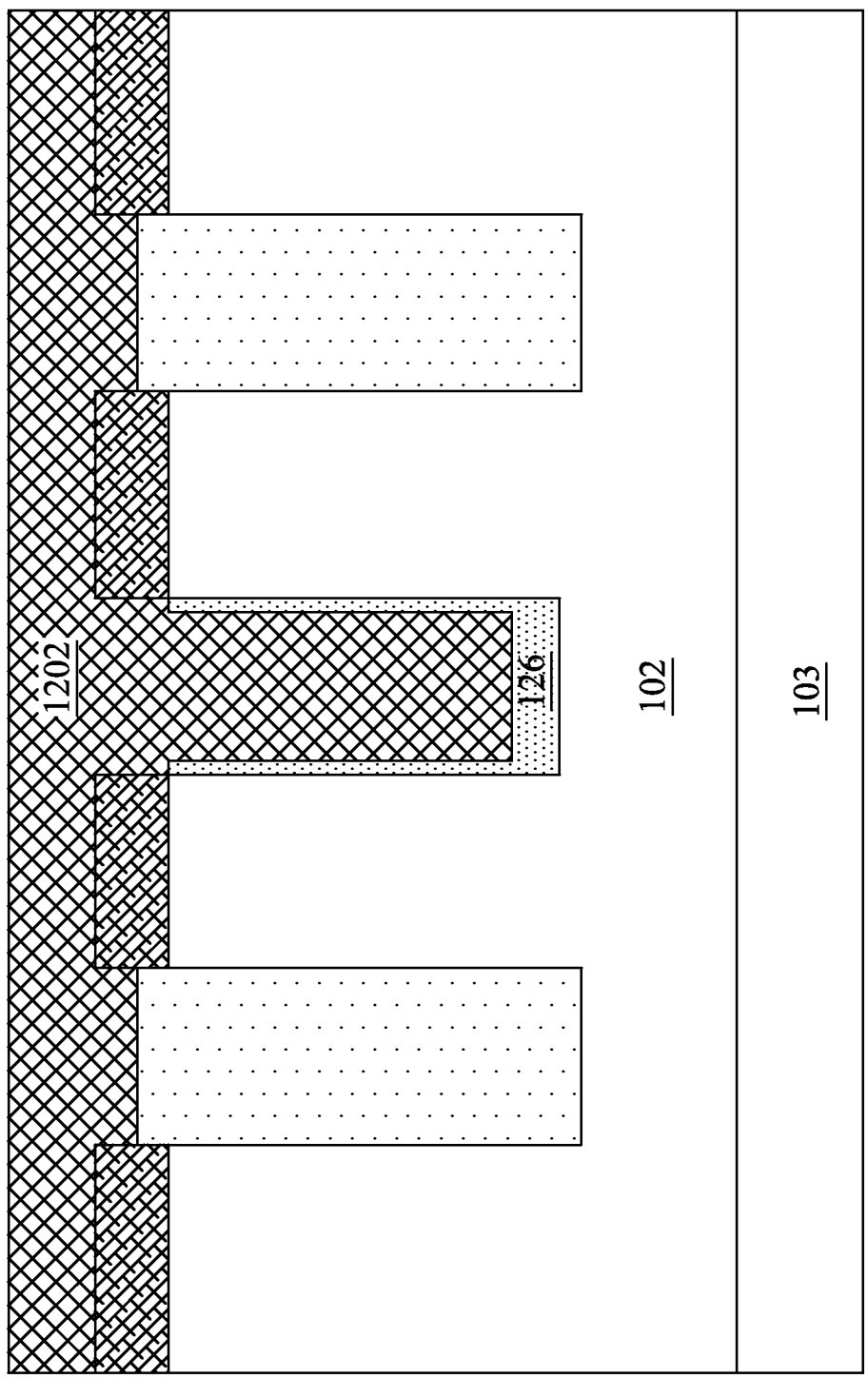
FIG. 12 illustrates a cross section view of the semiconductor device shown in FIG. 11 after a gate electrode material is filled in the trench 304 in accordance with an embodiment.

FIG. 12 illustrates a cross section view of the semiconductor device shown in FIG. 11 after a gate electrode material is filled in the trench 304 in accordance with an embodiment. The gate electrode layer 1202 may be formed of polysilicon. Alternatively, the gate electrode layer 1202 may be formed of other commonly used conductive materials such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

Figure 13:
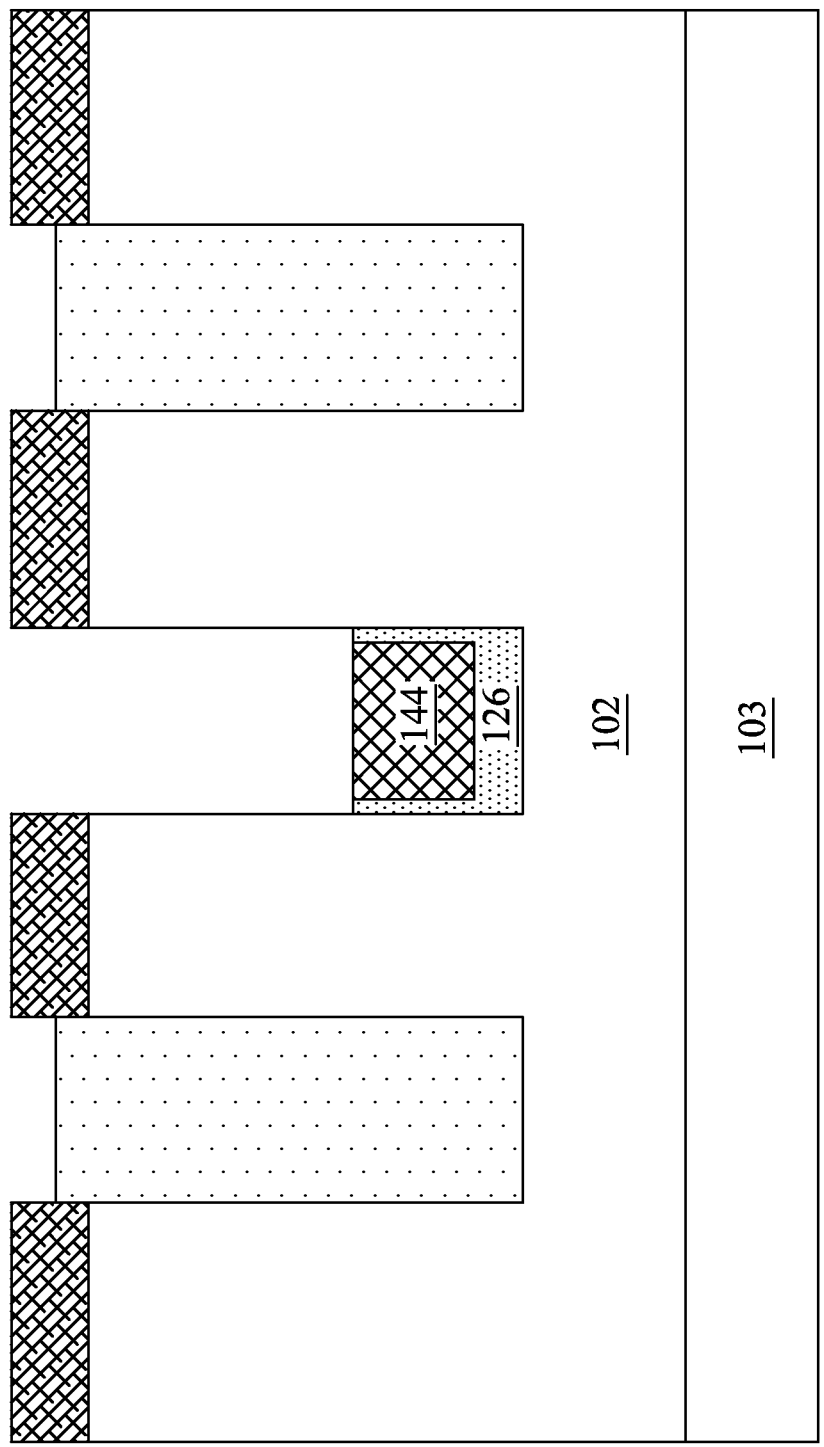
FIG. 13 illustrates a cross section view of the semiconductor device shown in FIG. 12 after an anisotropic etching process is applied to the trench 304 in accordance with an embodiment.

FIG. 13 illustrates a cross section view of the semiconductor device shown in FIG. 12 after an anisotropic etching process is applied to the trench 304 in accordance with an embodiment. An anisotropic etching process is applied to the trench 304 as well as the top surface of the semiconductor device. By controlling the strength and direction of the etching process, a portion of the gate electrode layer 1202 has been removed. Then, an isotropic etching process is applied to remove the dielectric layer on trench 304 sidewall. The remaining gate electrode layer is the second gate 144 shown in FIG. 1.

Figure 14:
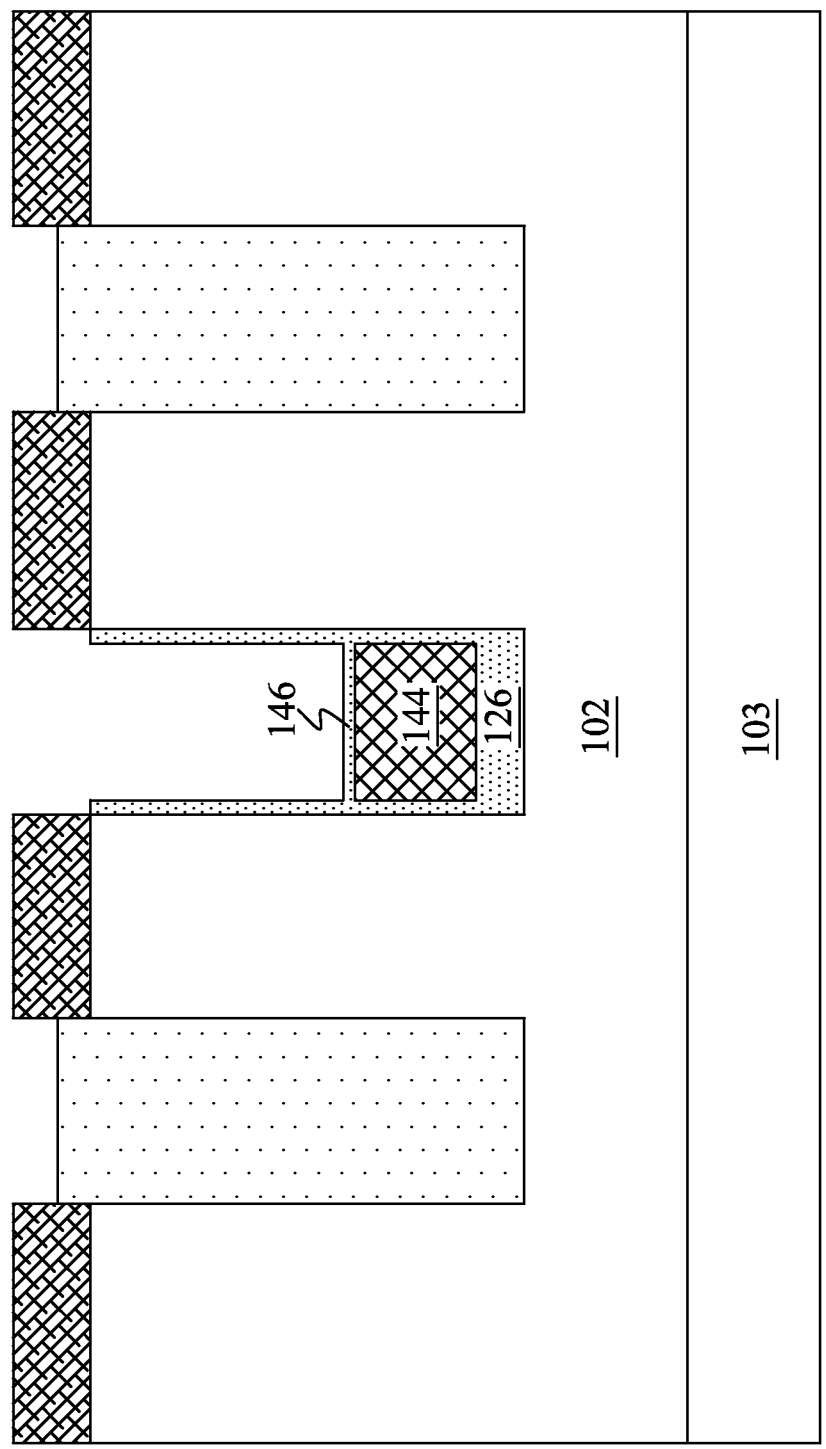
FIG. 14 illustrates a cross section view of the semiconductor device shown in FIG. 13 after a thin liner oxide layer is formed on the sidewalls of the trench 304 in accordance with an embodiment.

FIG. 14 illustrates a cross section view of the semiconductor device shown in FIG. 13 after a thin liner oxide layer is formed on the sidewalls of the trench 304 in accordance with an embodiment. The thin oxide layer may be thermally grown in the trench 304. The dielectric layer on the top surface prevents any additional oxidation on the top surface of the semiconductor device.

Figure 15:
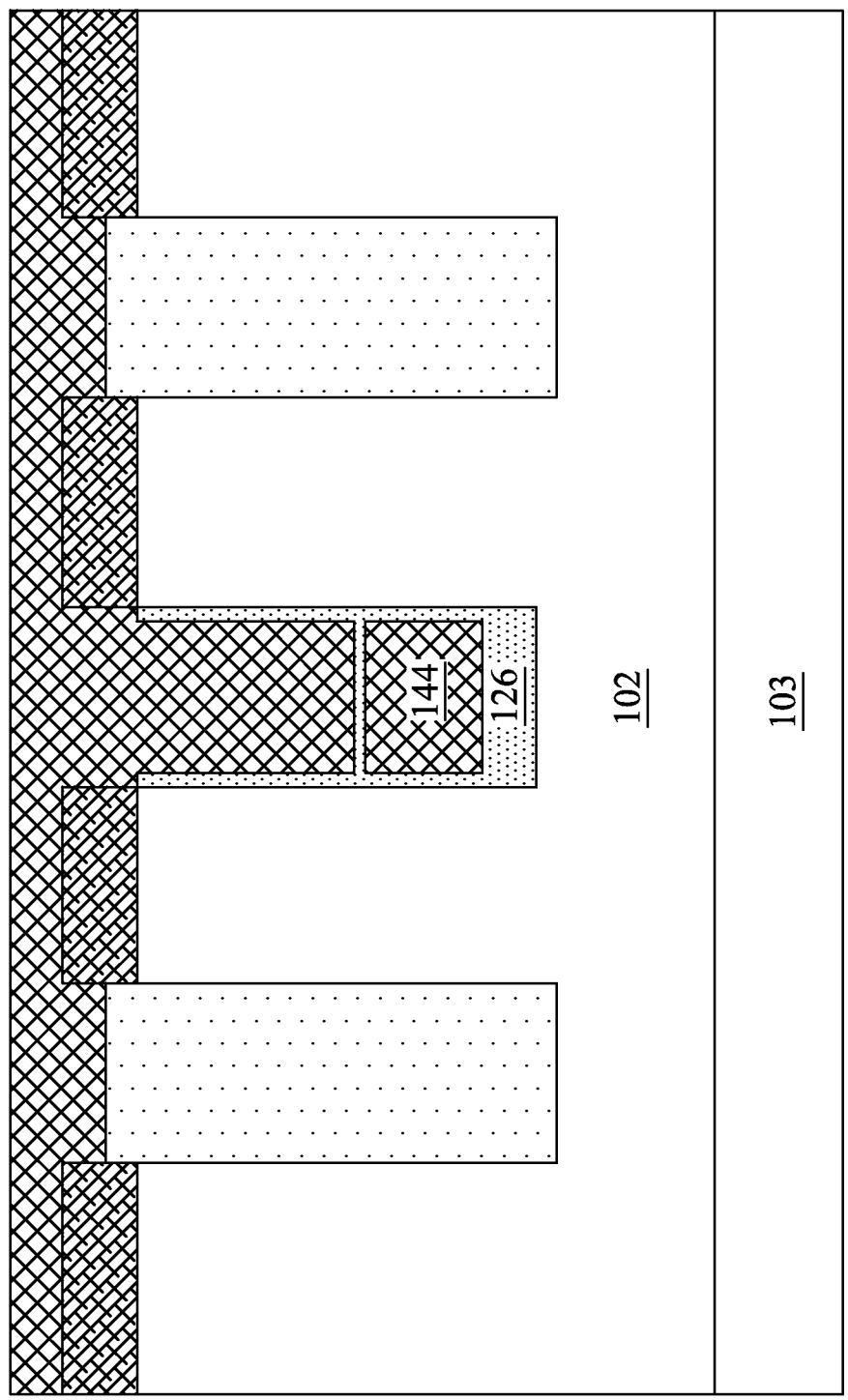
FIG. 15 illustrates a cross section view of the semiconductor device shown in FIG. 14 after a gate electrode material is filled in the trench 304 in accordance with an embodiment.

FIG. 15 illustrates a cross section view of the semiconductor device shown in FIG. 14 after a gate electrode material is filled in the trench 304 in accordance with an embodiment. The fabrication step of FIG. 15 is similar to that of FIG. 12, and hence is not discussed in further detail herein to avoid unnecessary repetition.

Figure 16:
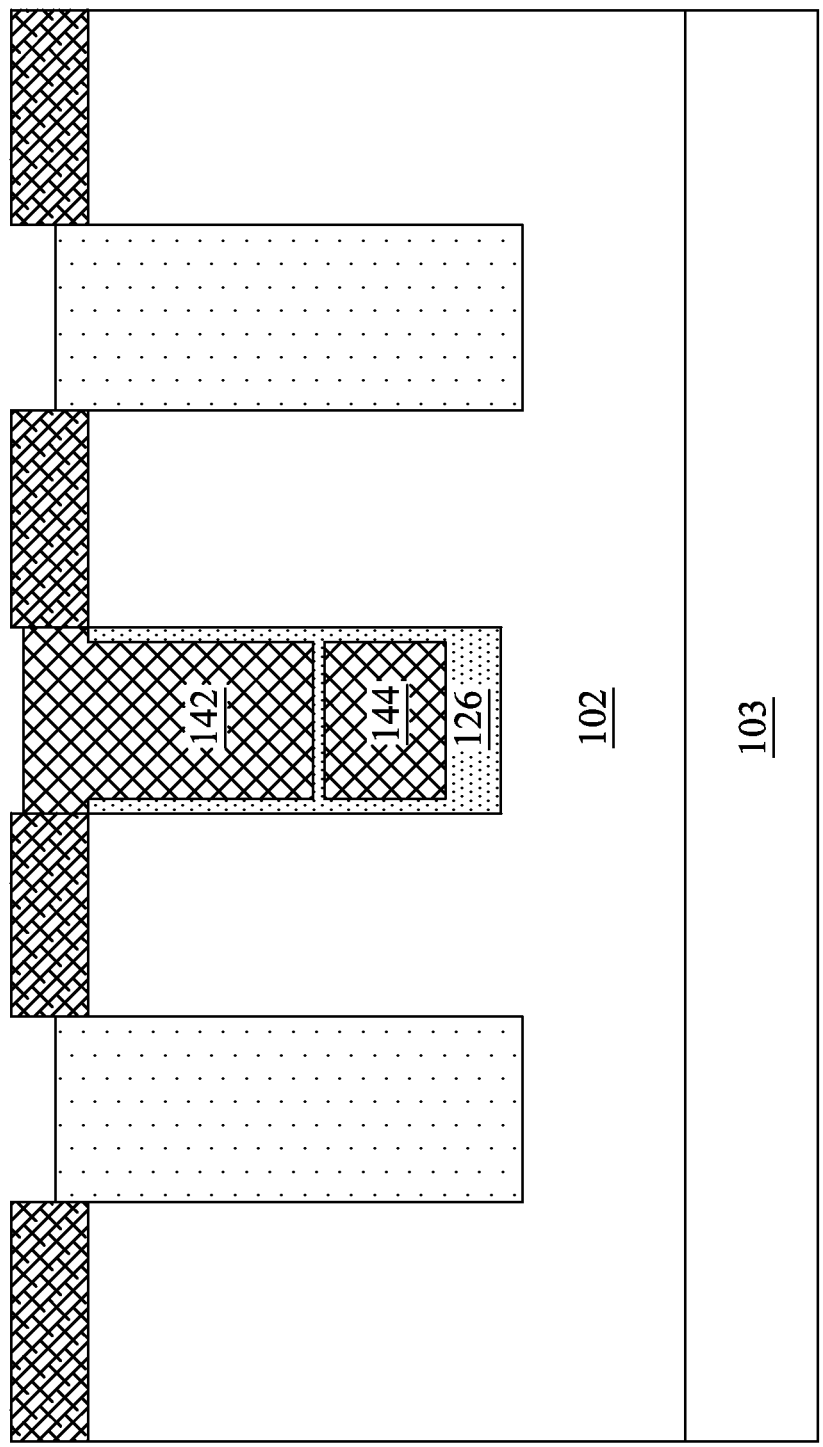
FIG. 16 illustrates a cross section view of the semiconductor device shown in FIG. 15 after a CMP process is applied to the top surface of the semiconductor device shown in FIG. 15 in accordance with an embodiment.

FIG. 16 illustrates a cross section view of the semiconductor device shown in FIG. 15 after a CMP process is applied to the top surface of the semiconductor device shown in FIG. 15 in accordance with an embodiment. A planarization process, such as a CMP process or etch back step, may be performed to planarize an upper surface of the semiconductor device. As a result, a portion of the gate electrode material has been removed.

Figure 17:
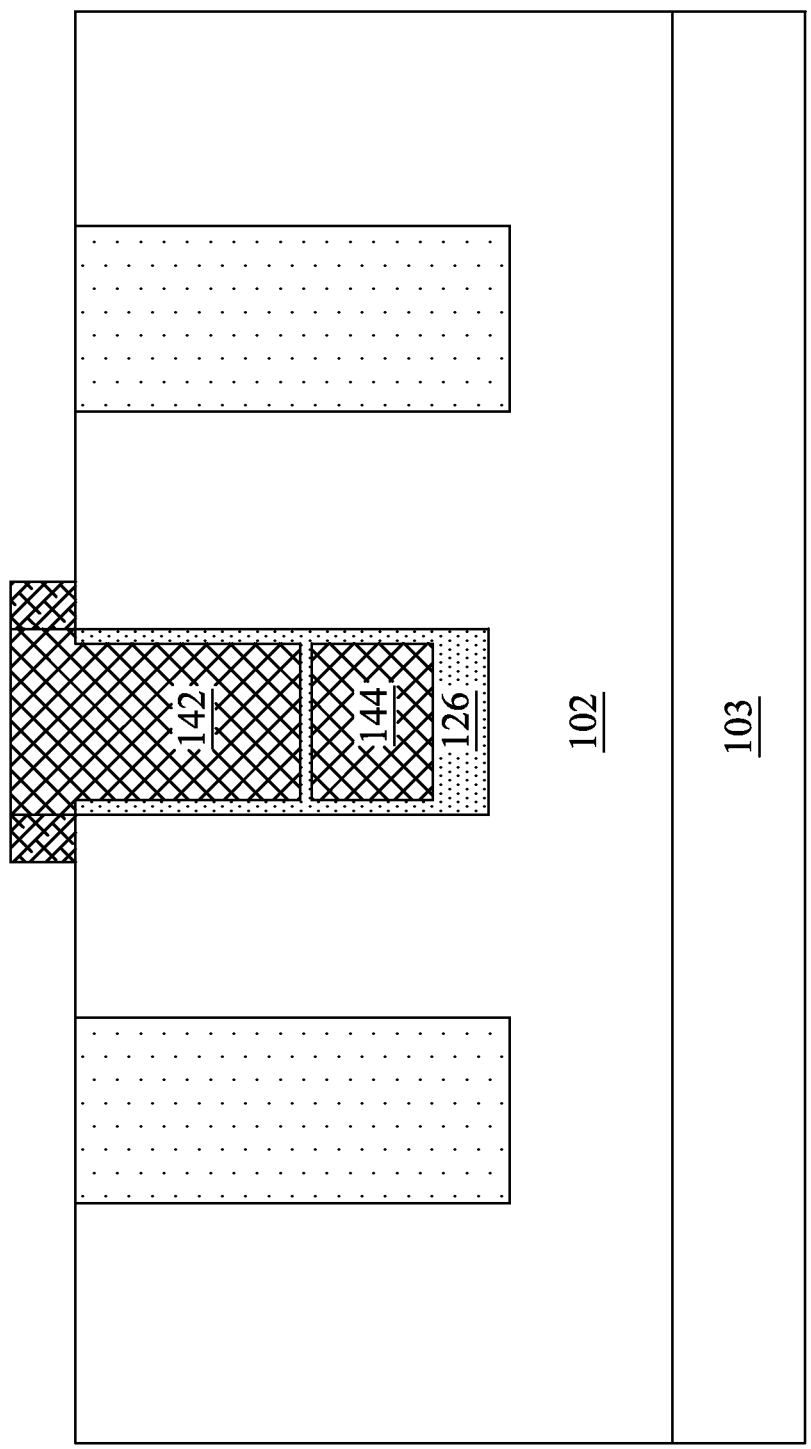
FIG. 17 illustrates a cross section view of the semiconductor device shown in FIG. 16 after an anisotropic etching process is applied to the top surface of the semiconductor device in accordance with an embodiment.

FIG. 17 illustrates a cross section view of the semiconductor device shown in FIG. 16 after an anisotropic etching process is applied to the top surface of the semiconductor device in accordance with an embodiment. An anisotropic etching process is applied to the top surface in accordance with an embodiment. The dielectric layer may be patterned, such as by anisotropically etching to form the spacers along the edges of the first gate 142 as illustrated in FIG. 17.

Figure 18:
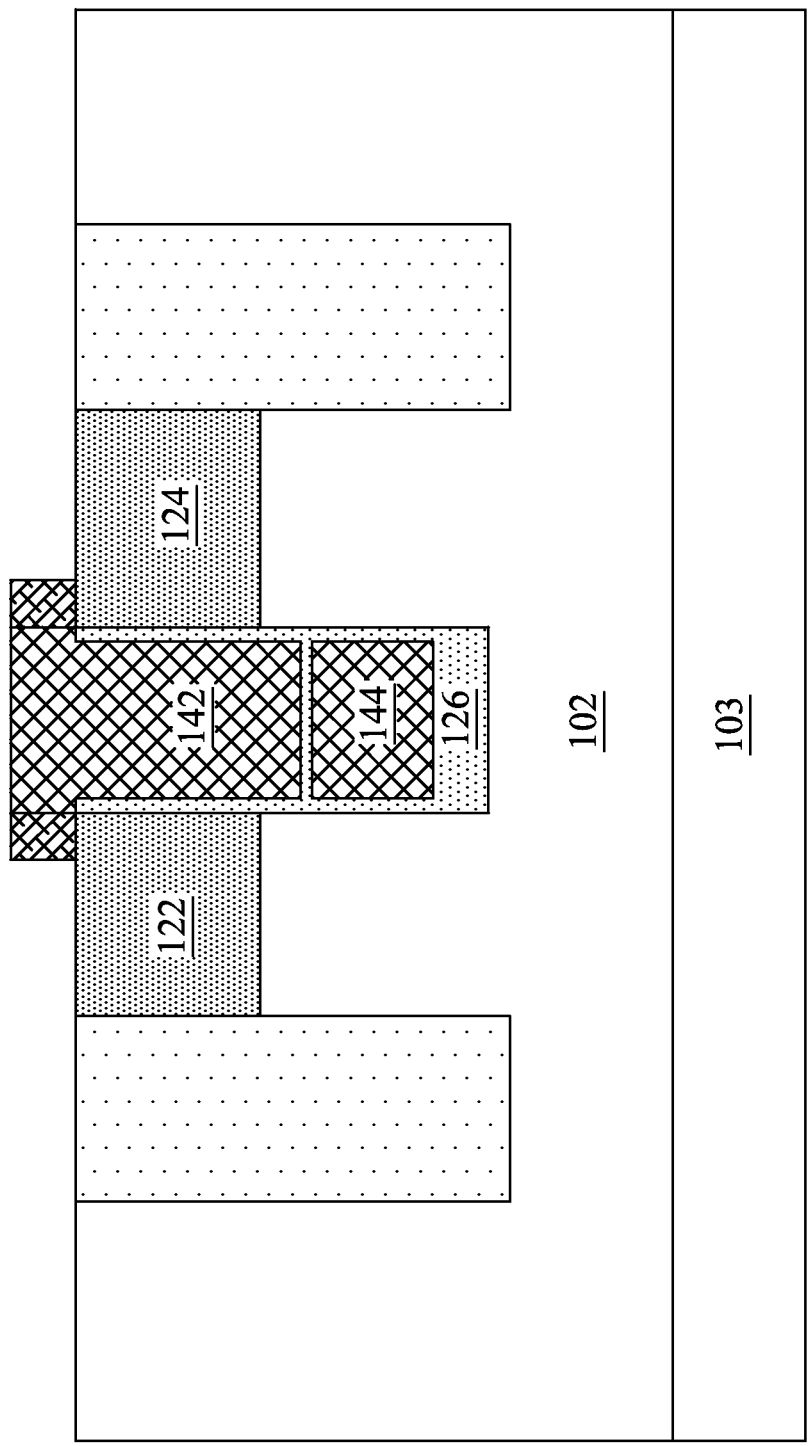
FIG. 18 illustrates a cross section view of the semiconductor device shown in FIG. 17 after body regions are formed in the substrate in accordance with an embodiment.

FIG. 18 illustrates a cross section view of the semiconductor device shown in FIG. 17 after body regions are formed in the substrate in accordance with an embodiment. Body regions 122 and 124 may be formed in the epitaxial layer 102 on opposing sides of the first gate 142. In accordance with an embodiment, when the substrate 103 is a p-type substrate, the body regions 122 and 124 may be formed by implanting appropriate p-type dopants such as boron, gallium, indium or the like. Alternatively, in an embodiment in which the substrate 103 is an n-type substrate, the body regions 122 and 124 may be formed by implanting appropriate n-type dopants such as phosphorous, arsenic, or the like. In accordance with an embodiment, the doping density of the body regions 122 and 124 is in a range from about $10^{16}/cm^3$ to about $5\times10^{17}/cm^3$.

Figure 19:
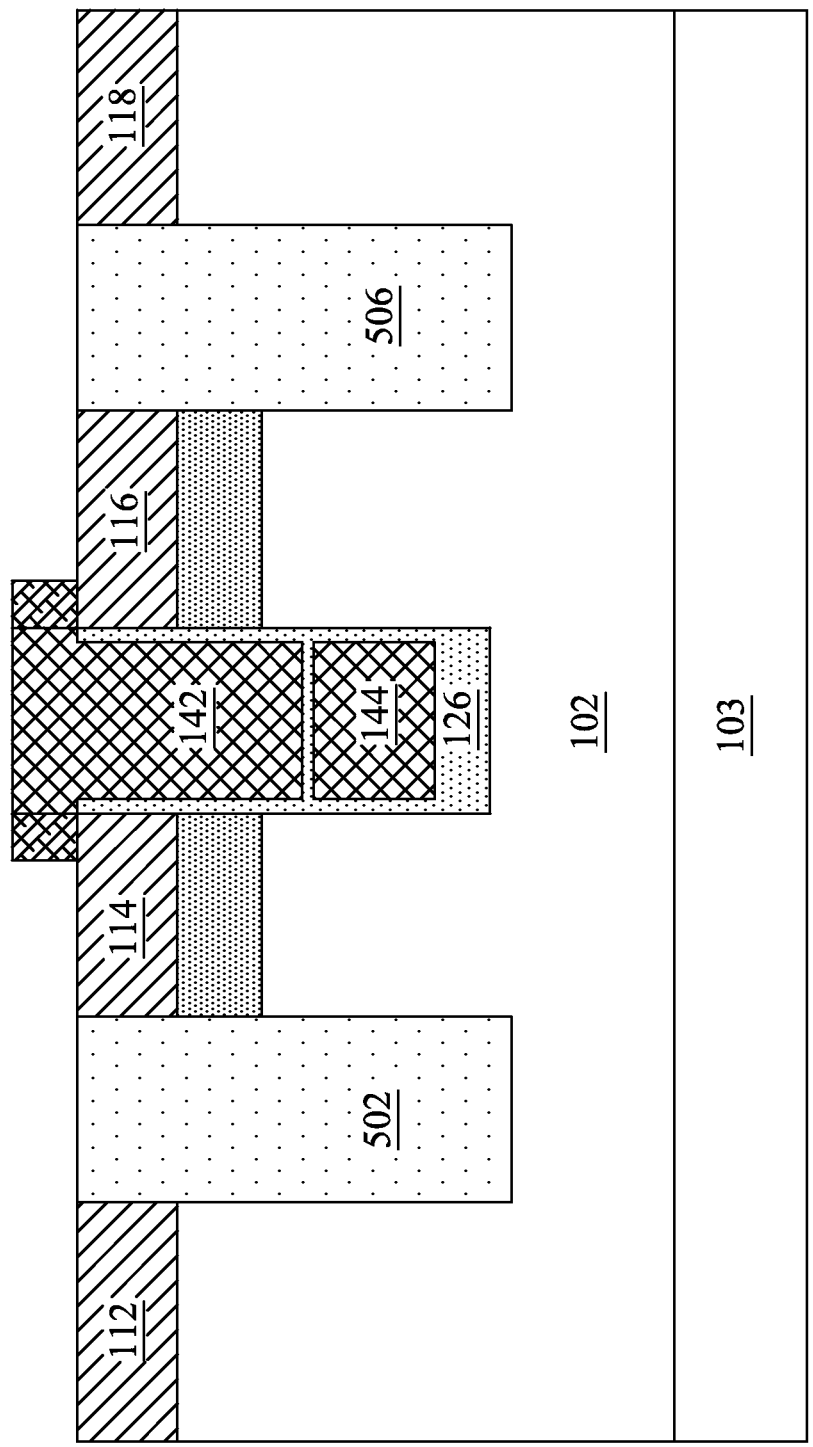
FIG. 19 illustrates a cross section view of the semiconductor device shown in FIG. 18 after drain/source regions are formed over the substrate in accordance with an embodiment.

FIG. 19 illustrates a cross section view of the semiconductor device shown in FIG. 18 after drain/source regions are formed over the substrate in accordance with an embodiment. The drain/source regions 112 and 114 may be formed over the substrate 103 on opposing sides of the first isolation region 502. Likewise, drain/source regions 116 and 118 may be formed over the substrate 103 on opposing sides of the second isolation region 506. In accordance with an embodiment, when the substrate 103 is an n-type substrate, the drain/source regions (e.g., drain/source region 112) may be formed by implanting appropriate p-type dopants such as boron, gallium, indium, or the like. Alternatively, in an embodiment in which the substrate 103 is a p-type substrate, the drain/source regions (e.g., drain/source region 112) may be formed by implanting appropriate n-type dopants such as phosphorous, arsenic, or the like. In accordance with an embodiment, the doping density of the drain/source regions (e.g., drain/source region 112) is in a range from about $10^{19}/cm^3$ to about $5\times10^{19}/cm^3$.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a substrate of a first conductivity;
   a first region of a second conductivity formed over the substrate;
   a body region of the first conductivity formed in the first region;
   an isolation region formed in the first region;
   a first drain region of the second conductivity formed in the first region, wherein the first drain region and the substrate are separated by the first region;
   a first source region of the second conductivity formed in the first region, wherein the first source region and the first drain region are formed on opposing sides of the isolation region;
   a second source region and a second drain region formed in the first region, wherein the second source region and the second drain region are formed on opposing sides of a second isolation region;
   a first dielectric layer formed over the first region in a gate trench;
   a first gate formed over the first dielectric layer in a gate structure, wherein the body region extends from a sidewall of the isolation region to a sidewall of the gate structure and a bottommost surface of the body region is higher than a bottommost surface of the isolation region;
   a second dielectric layer formed over the first gate; and
   a second gate formed over the second dielectric layer in the gate structure, wherein the second source region and the first source region are formed on opposing sides of the gate structure, and wherein a bottommost surface of the gate trench is level with a bottommost surface of the isolation region.

2. The semiconductor device of claim 1, wherein the first gate and the second gate are separated by the second dielectric layer.

3. The semiconductor device of claim 1, wherein:
   the first conductivity is P type; and
   the second conductivity is N type.

4. The semiconductor device of claim 1, further comprising a sidewall spacer formed between the second gate and the first source region.

5. The semiconductor device of claim 1, wherein the second gate and the first source region is separated by a thin dielectric layer.

6. The semiconductor device of claim 1, wherein the body region is of a doping density in a range from about $10^{16}/cm^3$ to about $5\times10^{17}/cm^3$.

7. The semiconductor device of claim 1, wherein:
   the first source region and the first drain region are of a doping density in a range from about $10^{19}/cm^3$ to about $5\times10^{19}/cm^3$.

8. The semiconductor device of claim 1, wherein the first region is an epitaxial layer grown from the substrate.

9. A device comprising:
   a drift region having a first conductivity type formed over a substrate;
   an isolation region formed in the drift region;
   a drain region having the first conductivity type formed in the drift region, wherein the drain region and the substrate are separated by the drift region;
   a channel region having a second conductivity type formed in the drift region;
   a source region having the first conductivity type formed in the channel region, wherein the source region and drain region are formed on opposing sides of the isolation region;
   a second drain region and a second source region wherein the second source region and the second drain region are formed on opposing sides of a second isolation region; and
   a gate structure comprising a first gate and a second gate formed adjacent to the source region, wherein the first gate and the second gate are stacked together in a gate trench and separated by a dielectric layer, and wherein the second source region and the source region are formed on opposing sides of the first gate, and wherein a bottommost surface of the gate trench is level with a bottommost surface of the isolation region, and wherein the second gate is a floating gate, and wherein the body region extends from a sidewall of the isolation region to a sidewall of the gate structure and a bottommost surface of the body region is higher than a bottommost surface of the isolation region.

10. The device of claim 9, wherein:
    the first conductivity type is an n-type conductivity; and
    the second conductivity type is a p-type conductivity.

11. The device of claim 9, wherein:
    the first conductivity type is a p-type conductivity; and
    the second conductivity type is an n-type conductivity.

12. The device of claim 9, further comprising:
a sidewall spacer formed between the second gate and the source region.

13. The device of claim 9, wherein the channel region is of a doping density in a range from about $10^{16}/cm^3$ to about $5\times10^{17}/cm^3$.

14. The device of claim 9, wherein:
the drain region and the source region are of a doping density in a range from about $10^{19}/cm^3$ to about $5\times10^{19}/cm^3$.

15. A method comprising:
providing a substrate with a first conductivity type;
growing an epitaxial layer with a second conductivity type on the substrate; forming an isolation region in the epitaxial layer;
forming a body region with the first conductivity type in the epitaxial layer;
implanting ions with the second conductivity type to form a drain region and a second drain region in the epitaxial layer, wherein the drain region and the substrate are separated by the epitaxial layer;
implanting ions with the second conductivity type to form a source region and a second source region in the body region, wherein the source region and the drain region are on opposing sides of the isolation region, and wherein the second source region and the second drain region are on opposing sides of a second isolation region;
forming a dual gate structure in a gate trench adjacent to the source region, wherein the source region and the second source region are on opposing sides of the dual gate structure, and wherein a bottommost surface of the gate trench is level with a bottommost surface of the isolation region; and
forming the body region between the isolation region and the dual gate structure, wherein the body region extends from a sidewall of the isolation region to a sidewall of the dual gate structure and a bottom surface of the body region is higher than a bottom surface of the isolation region.

16. The method of claim 15, further comprising:
forming a sidewall spacer along an edge of the dual gate structure, wherein the sidewall spacer isolates the dual gate structure from the source region.

17. The method of claim 15, further comprising:
forming a trench in the epitaxial layer using a first etching process;
forming a bottom dielectric layer in the trench;
filling a dielectric material in the trench;
removing a portion of the dielectric material in the trench;
forming a middle dielectric layer; and
filing the dielectric material on the middle dielectric layer.

18. The method of claim 15, wherein the dual gate structure comprises a second gate stacked on a first gate.

* * * * *